(12) United States Patent
Tahmassebpur et al.

(10) Patent No.: US 8,169,768 B1
(45) Date of Patent: May 1, 2012

(54) ELECTROSTATIC CHUCK

(75) Inventors: Mohammed Tahmassebpur, San Ramon, CA (US); Salam Harb, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 453 days.

(21) Appl. No.: 12/470,169

(22) Filed: May 21, 2009

Related U.S. Application Data

(60) Provisional application No. 61/059,855, filed on Jun. 9, 2008.

(51) Int. Cl.
*H01T 23/00* (2006.01)

(52) U.S. Cl. .... 361/234; 361/233; 118/728; 156/345.51

(58) Field of Classification Search .................. 361/234, 361/233; 118/728, 715; 156/345.51
See application file for complete search history.

(56) References Cited

U.S. PATENT DOCUMENTS

| | | | | |
|---|---|---|---|---|
| 5,903,428 A * | 5/1999 | Grimard et al. | | 361/234 |
| 6,117,246 A * | 9/2000 | Parkhe et al. | | 118/728 |
| 7,489,537 B2 * | 2/2009 | Tran | | 365/151 |
| 2002/0015275 A1* | 2/2002 | Sun et al. | | 361/234 |
| 2003/0010292 A1* | 1/2003 | Kholodenko et al. | | 118/728 |
| 2004/0055709 A1* | 3/2004 | Boyd et al. | | 156/345.51 |

OTHER PUBLICATIONS

N. Satyanarayana et al., "Carbon Nanotube Reinforced Polyimid Thin-film for High Wear Durability," Tribol Lett (2007) 27:181-199.

* cited by examiner

*Primary Examiner* — Patrick Salce
(74) *Attorney, Agent, or Firm* — Luedeka Neely Group, P.C.

(57) ABSTRACT

An electrostatic chuck for retaining a substrate. The chuck has a clamping surface for receiving the substrate, where the clamping surface is formed of a hard polymeric material filled with carbon nanotubes. Electrodes are disposed beneath the clamping surface, for inducing localized electrostatic charges in the substrate and thereby retaining the substrate against the clamping surface. A base supports the clamping surface and the electrodes.

12 Claims, 1 Drawing Sheet

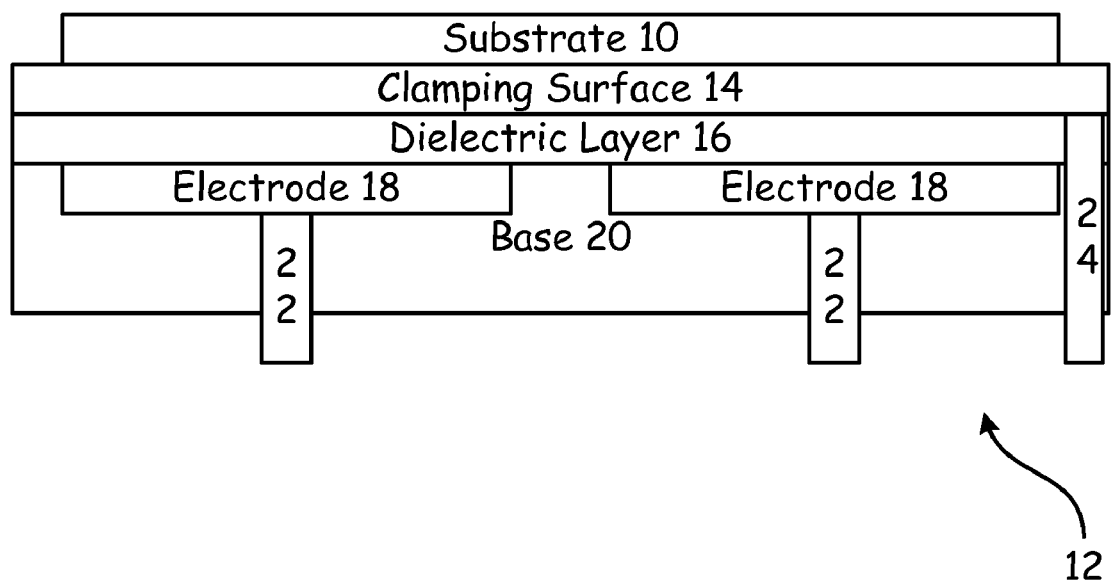

ELECTROSTATIC CHUCK

This application claims all rights and priority to U.S. provisional application Ser. No. 61/059,855 filed 2008 Jun. 9. This invention relates to the field of integrated circuits. More particularly, this invention relates to a chuck for holding the substrates that are variously used in the fabrication of integrated circuits.

FIELD

Background

In the integrated circuit fabrication industry, a chuck is a device that is used to hold a substrate of some sort. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

For example, chucks are used to hold the substrates on which the integrated circuits are fabricated, the masks or reticles from which the patterns used to form the integrated circuits are transferred, and other types of substrates. As used herein, the term "substrate" refers to all such substrates used in the integrated circuit fabrication industry.

One type of chuck is an electrostatic chuck. An electrostatic chuck holds a substrate by generating localized electrostatic charges that tend to draw the substrate against a clamping surface of the chuck. Thus, an electrostatic chuck does not rely upon the use of a pressure differential to create the motive force that retains the substrate against the clamping surface of the chuck. Further, an electrostatic chuck does not require the use of mechanical retaining mechanisms, such as springs or clips, to engage the substrate and retain it against the clamping surface of the chuck. As used hereafter, the term "chuck" generally refers to electrostatic chucks.

The clamping surface of an electrostatic chuck is formed of either a hard or soft material. As used herein, the term "hard" means a material that is harder than monolithic monocrystalline silicon, and the term "soft" means a material that is softer than monolithic monocrystalline silicon.

Electrostatic chucks with a hard clamping surface tend to contaminate the mating surface of the substrate (generally referred to as the "backside" of the substrate herein). They also tend to warp the substrate due to the inability of the hard surface to conform to the backside topography of the substrate. Electrostatic chucks with a soft clamping surface tend to erode through repeated use, which leads to an increase in backside contamination and damage to the clamping surface.

One problem with the polymers that are often used as the material in the clamping surface, be they hard or soft, is that they acquire an electrostatic charge due to triboelectric generation, or when they are exposed to an electric field, or a charged beam, such as an electron beam, an ion beam, or ultraviolet radiation, such as from an extreme ultraviolet laser. The material then discharges when it is exposed to an opposing potential or when the charge exceeds the dielectric strength of the material. Such discharges can spatter the clamping surface material on the substrate or elsewhere within the equipment in which the chuck is used. These discharges can create pin-holes in or delamination of the clamping surface, rendering the chuck unusable.

Further, the substrate material itself can acquire an undesirable bulk electrostatic charge (as opposed to the localized electrostatic charges used to retain the substrate against the clamping surface of the chuck), in much the same way as that described above in regard to the clamping surface. Such a static electric charge on the substrate not only causes processing problems, but can also cause catastrophic damage to the substrate due to an arcing discharge of the acquired charge.

What is needed, therefore, is a chuck that tends to reduce problems such as those described above, at least in part.

SUMMARY

The above and other needs are met by an electrostatic chuck for retaining a substrate. The chuck has a clamping surface for receiving the substrate, where the clamping surface is formed of a hard polymeric material filled with carbon nanotubes. Electrodes are disposed beneath the clamping surface, for inducing localized electrostatic charges in the substrate and thereby retaining the substrate against the clamping surface. A base supports the clamping surface and the electrodes.

In this manner, the carbon nanotubes provide a resiliency to the clamping surface that reduces erosion of the clamping surface and damage to the backside of the substrate. The carbon nanotubes also reduce the amount of particulate matter generated by the clamping surface. Other benefits are also realized, as described in more detail hereafter.

In various embodiments, the polymeric material is a polyimide. In some embodiments the carbon nanotubes include curvilinear multiwall carbon nanotubes, and in some embodiments the carbon nanotubes include single walled carbon nanotubes. In some embodiments a dielectric layer is disposed between the clamping surface and the electrodes, for electrically isolating the clamping surface. In some embodiments the carbon nanotubes provide an electrically conductive path from a face of the clamping surface that receives the substrate to an opposing face of the clamping surface, and the opposing face of the clamping surface is electrically connected to a voltage potential source, for maintaining the substrate at a desired potential during processing. In some embodiments the clamping surface is formed of at least one of a coating, a laminate, and a bonded sheet encompassing at least a portion of an upper surface of the electrostatic chuck.

BRIEF DESCRIPTION OF THE DRAWINGS

Further advantages of the invention are apparent by reference to the detailed description when considered in conjunction with the FIGURE, which is not to scale so as to more clearly show the details, wherein like reference numbers indicate like elements, and which is a side view of an electrostatic chuck with a clamping surface according to an embodiment of the present invention.

DETAILED DESCRIPTION

With reference now to the FIGURE, there is depicted a side view of a substrate 10 disposed on an electrostatic chuck 12 according to one embodiment of the present invention. A clamping surface 14 is formed over a dielectric layer 16, under which there are disposed electrodes 18. The surface 14, electrodes 18, and dielectric layer 16 are mounted on a base 20. Terminals 22 through the base 20 provide electrical connection to the electrodes 18. The base 20 of some embodiments also provides heating and cooling for the substrate 10, motion by translation, elevation, and rotation, and voltage potential control, such as electrical grounding or biasing, as described in more detail hereafter.

Only two electrodes 18 are depicted in the FIGURE, which electrodes 18 are used to induce the localized electrostatic charges that retain the substrate 10 against the chuck 12. However, it is appreciated that many such electrodes 18 are used in various embodiments of the present invention. The electrodes 18 represent monopolar, bipolar, or interdigitated multi-polar electrode configurations.

The material of surface 14 in one embodiment is a hard, low-wear, charge-dissipative ultra-pure polymer lightly filled with carbon nanotubes. The nanotubes of one embodiment are a curvilinear multiwall carbon nanotube nanocomposite. Single-walled carbon nanotubes are used in other embodiments. The polymeric material in one embodiment is a polyimide. Other hard, ultra-pure polymeric laminates or coating materials are used in other embodiments. The clamping surface 14 in various embodiments is applied in the form of a coating, a laminate, or a bonded sheet, encompassing the entire upper surface of the underlying structures 16, 18, and 20, or portions thereof. Other surfaces of the chuck 12 are also covered with this material in other embodiments.

The carbon nanotube material in the surface 14 helps to control the electrical conductivity of the surface 14 of electrostatic chuck 12. This control is not possible using conventional antistatic materials and fillers. Carbon nanotubes provide a rapid rate of charge dissipation that does not require as high a loading in a given charge sensitive application. This lower loading requirement in a polymeric material means good retention of physical properties and retention of excellent surface quality.

The carbon nanotube filler is extremely hard. The addition of the carbon nanotubes to the hard polymeric material significantly reduces the wear of the surface 14. The permeation rate of various gasses in the polymer with the carbon nanotube loading is considerably less than the same polymer loaded with carbon black and other conventional electrically conductive additives. This makes the material suitable for use in a high vacuum environment and with sensitive substrates 10.

Carbon nanotube loaded polymers do not exhibit the agglomeration of conventional materials within the polymeric matrix, which agglomeration creates voids and cavities within the polymer, leading to excessive dusting and particulation. Thus, polymers filled with carbon nanotubes show much lower sloughing than other electrically conductive loadings. This is an ideal property for use on a clamping surface 14 of an electrostatic chuck 12. Also, carbon nanotubes have a very small diameter of less than about ten nanometers. With such a small diameter, carbon nanotubes cannot impart any significant damage to a chucked substrate 10. In some embodiments, the carbon nanotubes are about ten microns in length. The superior dispersibility of carbon nanotubes in a polymer matrix leads to excellent flowability, dimensional stability, and isometric properties of the resultant material. One reason for this is that only a relatively low amount of carbon nanotubes are needed to achieve the desired electrical conductivity and wear resistance properties for the surface 14.

Multiwall curvilinear carbon nanotubes have a relatively higher aspect ratio (on the order of about 1:1000, diameter to length). Thus, a relatively lower loading of carbon nanotubes are needed to form a percolating mixture in a polymer and to impart the required electrical conductivity. Conversely, materials with a relatively lower aspect ratio, such as carbon black, chopped carbon fiber, or stainless steel, require relatively higher loadings to achieve similar electrical conductivities. The higher loading of such materials leads to dusting and contamination, and affects the surface finish, uniformity, and integrity of the polymeric material.

In one embodiment, the backside of the clamping surface 14 is electrically connected to a voltage potential source, such as through electrical contact 24. Because the carbon nanotubes within the surface 14 are electrically conductive and can be dispersed in a manner where there are electrically conductive paths through the carbon nanotubes from one face of the clamping surface 16 to another, they enable the substrate 10 to be maintained at the voltage potential of the source. Thus, the substrate 10 can be held at a desired potential during processing or other times. For example, the substrate 10 can be grounded to eliminate or reduce the build-up of bulk charges within the substrate 10, such as electrostatic charges, or otherwise biased as desired for processing.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An electrostatic chuck for retaining a substrate, comprising:
   a clamping surface for receiving the substrate, and formed of a hard polymeric material filled with carbon nanotubes,
   electrodes disposed beneath the clamping surface for inducing localized electrostatic charges in the substrate and thereby retaining the substrate against the clamping surface, and
   a base for supporting the clamping surface and the electrodes.

2. The electrostatic chuck of claim 1, wherein the polymeric material comprises polyimide.

3. The electrostatic chuck of claim 1, wherein the carbon nanotubes comprise curvilinear multiwall carbon nanotubes.

4. The electrostatic chuck of claim 1, wherein the carbon nanotubes comprise single walled carbon nanotubes.

5. The electrostatic chuck of claim 1, further comprising a dielectric layer disposed between the clamping surface and the electrodes, for electrically isolating the clamping surface.

6. The electrostatic chuck of claim 1, wherein the carbon nanotubes provide an electrically conductive path from a face of the clamping surface that receives the substrate to an opposing face of the clamping surface, and the opposing face of the clamping surface is electrically connected to a voltage potential source, for maintaining the substrate at a desired potential during processing.

7. The electrostatic chuck of claim 1, wherein the clamping surface is formed of at least one of a coating, a laminate, and a bonded sheet encompassing at least a portion of an upper surface of the electrostatic chuck.

8. An electrostatic chuck for retaining a substrate, comprising:

a clamping surface for receiving the substrate, and formed of a hard polymeric material filled with carbon nanotubes, a dielectric layer disposed beneath the clamping surface, for electrically isolating the clamping surface, electrodes disposed beneath the dielectric layer for inducing localized electrostatic charges in the substrate and thereby retaining the substrate against the clamping surface, electrical contacts to a backside of the clamping surface, for providing a voltage potential to the clamping surface and thereby maintaining the substrate at a desired voltage potential, and a base for supporting the clamping surface, dielectric layer, electrodes, and electrical contacts.

9. The electrostatic chuck of claim 8, wherein the polymeric material comprises polyimide.

10. The electrostatic chuck of claim 8, wherein the carbon nanotubes comprise curvilinear multiwall carbon nanotubes.

11. The electrostatic chuck of claim 8, wherein the carbon nanotubes comprise single walled carbon nanotubes.

12. The electrostatic chuck of claim 8, wherein the clamping surface is formed of at least one of a coating, a laminate, and a bonded sheet encompassing at least a portion of an upper surface of the electrostatic chuck.

* * * * *